United States Patent
Yang

[11] Patent Number: 5,889,791
[45] Date of Patent: Mar. 30, 1999

[54] SYSTEM, DEVICE AND METHOD OF FEC CODING AND INTERLEAVING FOR VARIABLE LENGTH BURST TRANSMISSION

[75] Inventor: Jian Yang, Mansfield, Mass.

[73] Assignee: Motorola, Inc., Schaumburg, Ill.

[21] Appl. No.: 696,446

[22] Filed: Aug. 13, 1996

[51] Int. Cl.$^6$ .................................................. H03M 13/00
[52] U.S. Cl. .................................... 371/37.01; 371/37.11; 371/39.1
[58] Field of Search .................. 371/37.01, 37.11, 371/39.1, 41; 370/348, 524; 375/206, 275; 380/34, 49; 348/155, 467

[56] References Cited

U.S. PATENT DOCUMENTS

| | | | |
|---|---|---|---|
| 4,059,825 | 11/1977 | Greene | 371/39.1 |
| 5,117,427 | 5/1992 | Miyake et al. | 371/37.4 |
| 5,321,725 | 6/1994 | Paik et al. | 375/265 |
| 5,341,396 | 8/1994 | Higgins et al. | 375/206 |
| 5,377,192 | 12/1994 | Goodings et al. | 370/348 |
| 5,473,621 | 12/1995 | Wei | 371/37.11 |
| 5,699,369 | 12/1997 | Guha | 371/41 |

*Primary Examiner*—Emmanuel L. Moise
*Attorney, Agent, or Firm*—Darleen J. Stockley; Jeffrey T. Klayman

[57] ABSTRACT

The present invention provides a system (100), device (400, 500) and method (600, 700) for forward error correction (FEC) coding and interleaving in a variable length burst transmission communications system. The system incorporates at least one shortened FEC encoder to accomplish FEC coding and burst interleaving for transmission from a variable length burst data source. Decoding/de-interleaving is accomplished by a device consisting of at least one fixed length FEC decoder. The technique of padding with zero symbols at the end of burst is used in the device to allow decoding with fixed length FEC decoders and for minimizing delay.

27 Claims, 3 Drawing Sheets

SYSTEM, DEVICE AND METHOD OF FEC CODING AND INTERLEAVING FOR VARIABLE LENGTH BURST TRANSMISSION

FIELD OF THE INVENTION

The present invention relates to multiple-access communications systems in which users transmit in variable length bursts. In particular, the invention relates to forward error correction (FEC) coding and interleaving in such variable length burst transmission systems.

BACKGROUND OF THE INVENTION

In multiple-access communication systems such as the bi-directional Hybrid Fiber Coax (HFC) cable system, multiple users communicate with a single central site or headend. In such systems, the headend typically receives bursts of transmissions from the users, and these transmissions are coordinated by the headend according to a Media Access Control (MAC) protocol, which prevents collisions and provides fair and equitable access to the upstream communication link from the users to the headend.

Typically, the channel in such systems is subject to various types of noise, in particular impulse noise, which is characteristically of short duration but has a strong magnitude and a wide spectrum footprint. In order to provide a reliable link, it is desirable to use forward error correction coding techniques, e.g., the Reed-Solomon (RS) code, which are known to support reliable impulse noise resistance. Furthermore, the impulse noise immunity may be multiplied by a factor of "I" without additional redundancy by using FEC coding in conjunction with interleaving, where "I" is referred to as the depth of interleaving.

However, in a burst transmission environment, particularly variable length burst transmission systems, a straightforward application of these error correction techniques will require precise end-of-burst detection and result in undesirable side effects such as extra delay and system complexity.

Firstly, the most often used impulse resistant FEC codes, such as RS code, are fixed length block codes. It is not trivial to implement such coding techniques for variable length burst transmission since it is undesirable to break a FEC code block across bursts due to delay considerations. It is known in the art that RS codes can be shortened to suit the length of burst on a burst by burst basis. However, this requires the receiver to determine the exact length of the burst before the decoding is completed. This requires expansive end-of-burst detection schemes at the cost of precious channel bandwidth and receiver complexity.

Secondly, interleaving requires a fair amount of delay. There are two types of well-known interleavers: block interleavers and convolutional interleavers. It is known that, when used with a rate (N,K) block code, i.e., "K" payload symbols in every length "N" code block, to achieve depth "I" interleaving, a block interleaver requires "N*I" symbol memory at the transmitter and the receiver and introduces total end-to-end delay of "2*N*I" symbols. On the other hand, a convolutional interleaver only requires "N*I/2" symbol memory at the transmitter and the receiver and the total end-to-end delay reduces to "N*I". This makes the convolutional interleaver attractive from the viewpoint of complexity and delay. However, with the convolutional interleaver, bursts of continuous input data symbols will map into overlapping segments of an interleaved data stream. This implies that one has to interleave across bursts, a very undesirable restriction. Alternatively, one has to deal with the initialization problem, i.e., how to fill the overlapping region with data symbols from the same burst. This seems impossible without introducing extra delay and/or compromising impulse noise resistance. In addition, it seems to be equally difficult for the convolutional interleaver to handle variation in burst length.

From a cost point of view, in a multiple access system, the subscriber transmitters are typically more cost-sensitive relative to the headend receiver since, in a typical system, there are many times more subscriber transmitters than there are head end receivers. Thus, it is desirable to keep the subscriber transmitter as non-complex as possible. Both types of interleavers, block or convolutional, require the same amount of memory at the transmitter and the receiver. Thus, neither the block interleaver nor the convolutional interleaver can take advantage of the uneven cost sensitivity in the multiple access systems. Hence, there is a need for a system, device and method for allowing end-of-burst detection while minimizing overall delay.

DETAILED DESCRIPTION OF A PREFERRED EMBODIMENT

Figure 1:
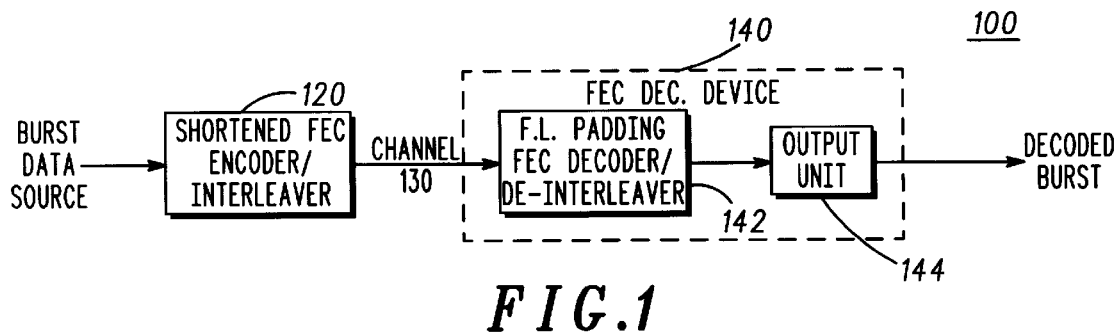
FIG. 1 shows a block diagram of one embodiment of a system utilizing burst FEC coding technique in accordance with the present invention.

In the present invention, a system, device and method for applying FEC coding and interleaving for variable length burst transmission are described. The system, device and method use a systematic cyclic code such as Reed-Solomon (RS) code by implementing a padding technique to allow the use of a fixed length block FEC code for a variable length burst without breaking the block code across bursts. The system, device and method allows for reliable end-of-burst detection and minimizes overall delay with a low implementation complexity. The exact length of the burst is determined after the FEC decoding, and thus is highly reliable.

The padding technique may also be used in conjunction with interleaving. With a special arrangement of the FEC encoder and interleaver, a convolutional interleaver may be matched for total end-to-end delay and memory requirement without the initialization problem. The padding technique is shown to be equally applicable to the arrangement of a FEC encoder and interleaver, resulting in a FEC encoding and interleaving scheme that works in variable length burst transmission system. As a bonus benefit, the entire memory usage under the scheme of the present invention is at the receiver, which is typically less cost-sensitive than the transmitter in a multiple-access environment. In contrast, a convolutional interleaver distributes the same total memory usage evenly between the transmitter and receiver.

The present invention is based on the padding technique described below.

Obviously, for fixed length code to handle variable length burst, the last block of each burst creates a problem since it may not contain enough data symbols for a whole block.

At the transmitter, the last and possibly partial FEC block is conceptually padded with zeros at the beginning of the block to form a whole input block of K symbols, i.e.,

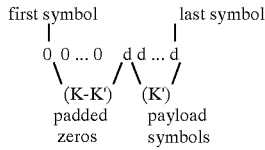

The encoded block can then be determined using the rate (N,K) encoder. For systematic code, the encoded block is formed by appending the computed redundant symbols at the end of the input block, i.e.,

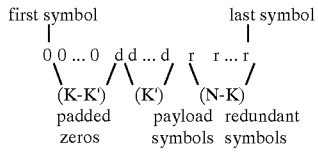

The transmitted symbols are:

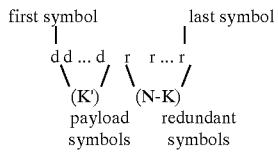

i.e., the padded zero symbols are not sent. In fact, the actual padding is not necessary even for the FEC encoder. For a systematic cyclic code, the FEC encoder computes redundant symbols as a remainder by dividing the polynomial formed by the input block by a fixed polynomial of order (N-K), which is referred to as the generator polynomial of the code. Clearly, the padded zero symbols at the beginning of the input block do not affect the redundant symbols. This encoding process is equivalent to the shortened RS coding which is known in the art.

A key feature of the invention is implemented at the receiver, which always decodes using a constant block size, i.e., the last block of burst is decoded using the same block size as the other blocks. This eliminates the need for determining the exact length of the burst before decoding. As shown later, the exact length of the burst can be determined by examining the decoded data. This greatly improves reliability as most channel errors are removed in the decoding process.

In order to use the same block size to decode the last and possibly shortened FEC block, padding will be necessary. However, adding zeros at the front of the block as in the transmitter is undesirable, since the receiver then needs the knowledge of the exact size of the last block to determine how many zero symbols to pad. Even if the exact block size can be determined at the end of the burst, this would introduce unwanted delay. In the present invention, the problem is avoided by padding zeros at the end of the block, i.e., feeding the FEC decoder with,

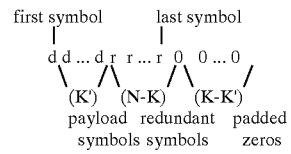

This is done by padding zeros after the detected final symbol until a whole block (N symbols) is filled. Clearly, the resulting block is a cyclic shift of the original code word formed in the encoder by padding zeros in the front, possibly with channel errors. It can be shown that the performance of the FEC coding is not effected by the cyclic shift. In fact, notice that the FEC decoder operates to find the code word that has the minimum Hamming distance to the received block. For example, consider the instance in which code word C is what the decoder finds without the cyclic shift, and C' is what the decoder finds with the cyclic shift. C' will be the cyclic shifted version of C. In fact, from the definition of cyclic code, the cyclic shifted version of C is also a code word, and it must be the closest code word to the cyclic shifted version of the received block, since cyclic shift does not affect the Hamming distance. This result can be generalized to include the case where the (N,K) code is not cyclic, but is a code obtained by shortening a cyclic code by constraining a necessary number of symbols at the front of the code word to be zero and excluding these symbols in the shortened code word.

An advantage of the invented scheme is that the end-of-burst detection does not need to be exact. The effect of an early end-of-burst detection is typically the zeroing of one or more redundant symbols, and that of an late end-of-burst detection is replacing one or more zeros with random symbols. These types of errors can be corrected by the FEC decoder under certain conditions. In fact, in order to achieve the same average block error rate performance as if the exact burst length were known, it is only required that:

Condition #1) the probability that the end-of-burst is off by B symbols is less than the uncoded B symbol error probability.

This is in contrast to requiring that:

Condition #2) the probability that the end-of-burst is off be less than the block error probability of the coded system, i.e., (N-K)/2 symbol error probability of the uncoded system.

The much stricter latter requirement is needed by the conventional shortened FEC scheme where the exact length of burst must be determined before decoding, and any offset results in decoding errors. Under the invented scheme, offset of end-of-burst by less than (N-K)/2 symbols can be tolerated to a certain degree, and the less the offset, the higher the degree of tolerance. This is achieved by utilizing the error correction capability of the FEC code. Clearly, this will only work if the end-of-burst is detected in the same FEC block as the one in which the burst ends, i.e., the receiver correctly identified the final block. This requirement can be satisfied if the end-of-burst detector utilizes the knowledge that an FEC block is at least (N-K) symbols long. In fact, such an detector ensures that the end-of-burst must be off by at least (N-K)/2 symbols in order for it to identify the final block incorrectly. The probability of such an event is thus less than the block error rate of the coded system as long as condition #1) is satisfied.

The invented scheme becomes especially attractive in the presence of impulse noise, whose resistance is the objective of most FEC schemes. Due to the short duration nature (shorter than the duration of (N-K)/2 symbols) of impulse noise, the end-of-burst detection is typically offset by less than (N-K)/2 symbols even if being hit by an impulse. Under the invented scheme, this type of error is correctable.

The invented scheme allows the FEC decoder to correct channel errors with a coarse end-of-burst detection. However the receiver still needs to determine the last data (d d . . . d) symbol. This can be accomplished in one of several ways.

1) Using a higher layer protocol, e.g., a HDLC based protocol. The extraneous HDLC frame(s) formed by the redundant symbols and padded zeros is likely to fail the CRC check and thus be discarded by the higher layer. As another example of such a higher layer protocol, the burst may contain an integer number of ATM cells. The higher layer processing may use this knowledge to determine the exact end-of-burst as long as the coarse end-of-burst detection accuracy is within one ATM cell.

2) Including a length field in the burst. This method is made reliable by the invented scheme, since the length field is only needed after the FEC decoding and thus is protected by the FEC code.

3) Adding a flag to the padding as described below.

In the method 3), the transmitter pads the final block as follows:

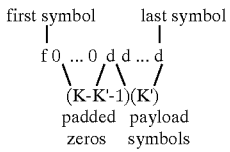

where the first padded symbol "f" is a flag agreed between the transmitter and receiver and is nonzero. Note that if the information data happens to be an integer multiple of FEC blocks, an extra block is needed that contains the flag followed by all zero symbols.

The encoder operation is similar to what is described above, except that the redundant symbols (r r . . . r) are formed as, $$R(x)=R0(x)+R1(x)$$

where, $R0(x)$ represents the redundant symbols for data as described above, and $R1(x)$ represents the redundant symbols for the following fixed block:

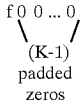

Since $R1(x)$ is constant and can be precomputed, this will not significantly increase the implementation cost of the transmitter. The transmitted symbols become:

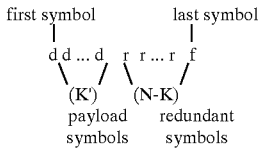

The receiver processing is exactly the same as the above, i.e., padding zeros at the end of the block to make it a whole block:

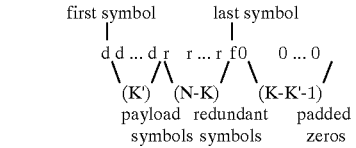

Now, after the FEC decoding, the last symbol of data can be determined by first removing the zeros between the flag and the end of block, then removing the flag, and finally removing (N-K) redundant symbols. The importance of the flag is to allow the receiver to separate the padded zeros from the redundant symbols.

FIG. 1, numeral 100, shows a block diagram of one embodiment of a system utilizing the burst FEC coding technique in accordance with the present invention. A burst data source generates payload burst data. The length of the payload typically varies from burst to burst. The payload burst data is processed by a shortened FEC encoder (120) to produce an encoded burst. The shortened FEC encoder (120) may also, where selected, include an interleaver. The shortened FEC encoder/interleaver (120) implements a systematic cyclic code, as is typically used in the type of application in concern here. In particular, when the interleaver is not selected, the payload burst data are broken up into blocks of K symbols each, except for the last block which may contain less than K symbols. The shortened FEC encoder determines the (N-K) redundant symbols needed for each block to form the encoded burst. For the last block, shortened code is used that is equivalent to encoding a whole FEC block formed by padding zero symbols to the front of the block. As is known in the art, this can be implemented by simply terminating the encoding process at the end of the burst. The transmission of the burst ends immediately after the redundant symbols for the last block. The processing of the encoder/interleaver (120) when the interleaver is selected will be described in detail in conjunction with FIG. 3, numeral (300).

A channel (130) in FIG. 1 includes the modulation processing at the transmitter as well as the demodulation processing at the receiver. It also introduces channel errors to the encoded burst.

At the receiver, a FEC decoding device (140) comprises a fixed length padding FEC decoder (142) and a output unit (144). When selected, the fixed length padding FEC decoder may also include a de-interleaver. The fixed length padding FEC decoder/de-interleaver is based on a fixed length (N,K) FEC decoder in accordance with the present invention. In particular, when the de-interleaver is not selected, the received burst is decoded block by block using the fixed length padding (N,K) FEC decoder (142), wherein the last block is made a whole block containing N symbols by padding zeros at the end of the block. These padded symbols and the redundant symbol added by the encoder are removed by the output unit (144) to form the decoded burst. The details of the FEC decoding device is described below in conjunction with FIG. 4, numeral (400) and FIG. 5, numeral (500) for the cases with and without de-interleaver respectively.

Figure 2:
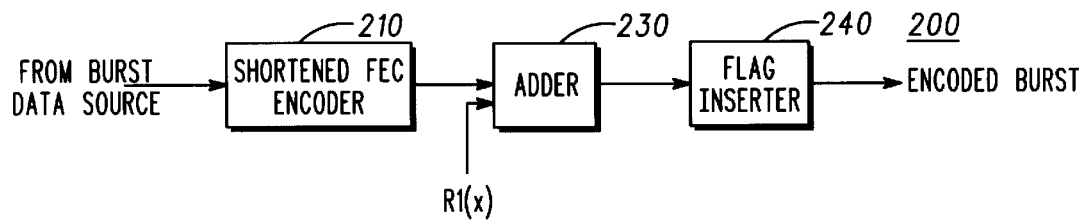
FIG. 2 shows details of an alternative form of the shortened FEC encoder that can be used in the system of FIG. 1 in accordance with the current invention.

FIG. 2, numeral 200, shows a block diagram of the details of an embodiment of a FEC encoder (120) that further provides insertion of a flag in accordance with the present invention. In this embodiment, the shortened FEC encoder (120) of FIG. 1, reproduced as element (210) in FIG. 2, is augmented with an adder (230) and a flag inserter (240). The function of (210) is that of shortened FEC encoder (120) as described in conjunction with FIG. 1. In particular, blocks other than the last block are encoded with regular (N,K) code and the last block is encoded using shortened FEC code.

The adder (230) modifies the redundant symbols of the last block by summing the redundant symbols produced by the shortened FEC encoder (210) with a precomputed symbol pattern R1(x). All the other input symbols to the adder (230) are output unchanged. The summation performed by the adder (230) is done symbol by symbol and each symbol summation is that of Galois field on which the FEC code is defined. The specification of the pattern R1(x) is as described above.

The flag inserter (240) inserts a predetermined flag at the end of the burst, i.e., immediately following the modified redundant symbols of the last block, and outputs the flag-inserted burst. The burst transmission ends immediately after the padded flag.

Figure 3:
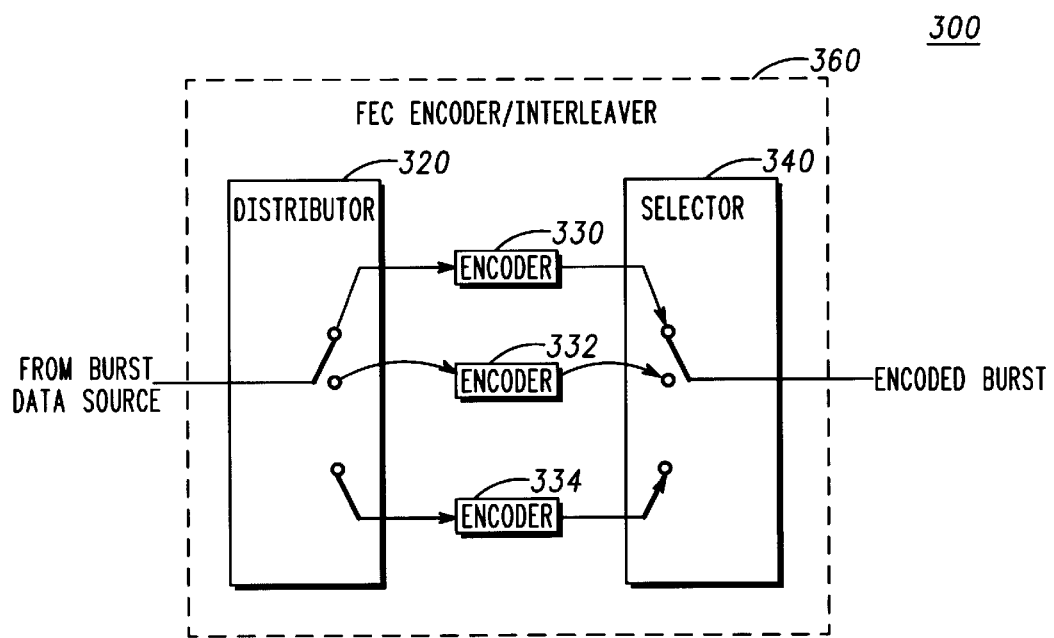
FIG. 3 shows details of the shortened FEC encoder incorporating interleaving in accordance with the present invention.

FIG. 3, numeral 300, shows a block diagram of one embodiment of the details of the shortened FEC encoder/interleaver (120) incorporating interleaver in accordance with the present invention. In this embodiment, the shortened FEC encoder/interleaver (120), reproduced as element (360), includes a distributor (320), a plurality of encoders (330, 332, . . . , 334) that perform FEC encoding, and a selector (340). The payload data symbols from the burst data source are distributed by the distributor (320), typically a switch, sequentially onto "I" outputs in a round robin fashion. Here "I" is a preselected integer representing the depth of interleaving. Each of the "I" encoders, (330, 332, . . . , 334) accepts data symbols from one output of the distributor (320) and produces encoded data symbols. The encoded data symbols from the encoders are selected by a selector (340), typically a switch, sequentially from an encoded burst. The selection is in a round robin fashion that is synchronized with the distributor (320).

Figure 6:
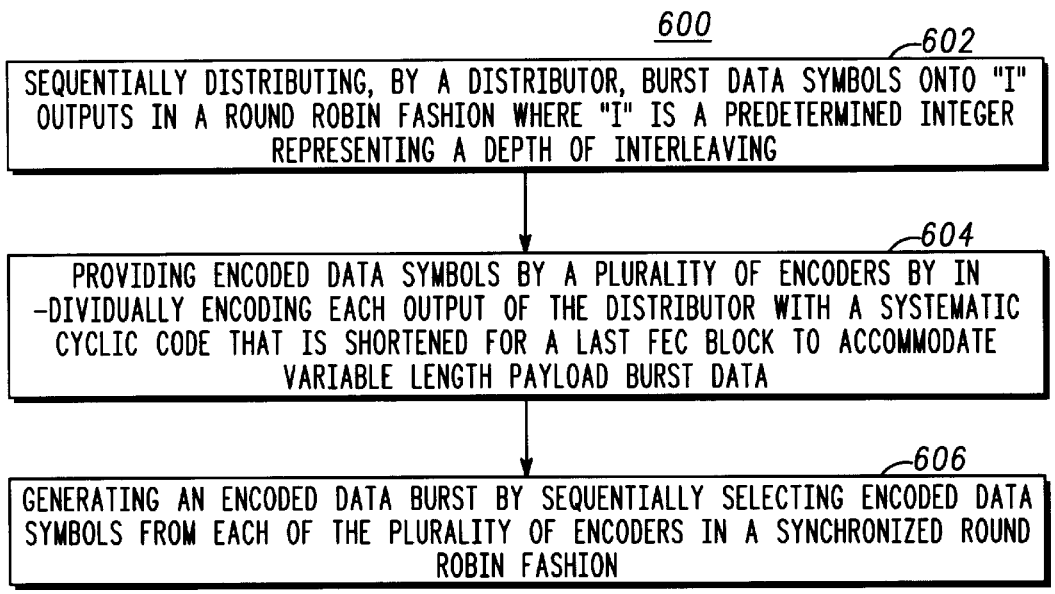
FIG. 6 is a flow chart showing steps of one embodiment of a method for FEC encoding/interleaving in accordance with the present invention.

Each of the "I" encoders, (330, 332, . . . , 334), is of the shortened type, as set forth above for the shortened FEC encoder (120). Alternatively, if the scheme 3) discussed above is used to mark the beginning of the padded zeros with a flag, each of these encoders is of the type shown in FIG. 2. In the latter case, for each burst, the adders and flag inserters in all but one of the encoders (330, 332, . . . , 334) output their input symbols unchanged. The excluded encoder is the one that is processing the last symbol of the payload burst. The adder in this encoder modifies the redundant symbols of the last block by adding the symbol pattern R1(x) while forwarding all other input symbols to the output unchanged. The flag inserter in this encoder inserts a predetermined flag symbol immediately following these modified redundant symbols. This results in a single flag being appended at the end of the burst. This is sufficient to ensure that in the receiver, the FEC decoding device (140) described in conjunction with FIG. 6 is able to determine the exact length of the burst after FEC decoding/de-interleaving.

FIG. 3 may be viewed as a general form of the shortened FEC encoder/interleaver, since the case when the interleaver is not selected, as described in conjunction with FIG. 1 and FIG. 2, may be viewed as a special case of FIG. 3 with I=1. To see the effect of interleaving, it is clear that any "I" consecutive symbols in the encoded symbol stream are produced by different encoders. Thus, impulse noise resistance of depth "I" interleaving is achieved.

Note "I" encoders are needed, as opposed to a single encoder necessary to implement a conventional block or convolutional interleaver. However, the encoder in conventional interleavers must operate at a symbol rate which is "I" times the rate at which the encoders in FIG. 3 have to operate. Therefore, the overall complexity of the system does not increase, especially when the system is implemented in software. In fact, since no memory is needed in FIG. 3 other than the memory used by the state machine of the encoders, the complexity at the transmitter is likely to be much lower than that using a conventional interleaver.

Figure 4:
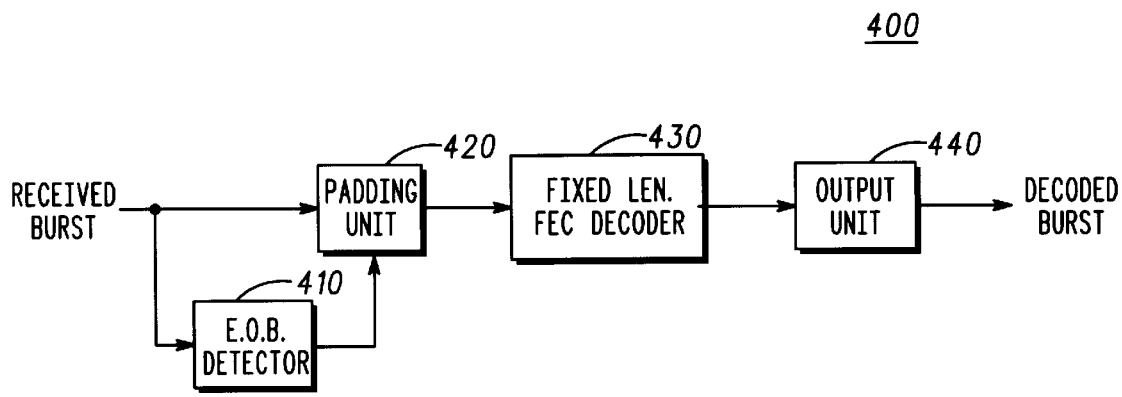
FIG. 4 shows a block diagram of one embodiment of a FEC decoding device in accordance with the present invention.

FIG. 4, numeral 400, is a block diagram of a device for forward error correction (FEC) decoding in a variable length burst receiver in accordance with the present invention. The device includes an end-of-burst detector (410), a padding unit (420), a fixed length FEC decoder (430), an output unit (440). The end-of-burst detector (410) is operably coupled to receive and monitor symbols of a received burst from channel and is used for providing a coarse end-of-burst signal which may have an offset with regard to the actual end-of-burst. The processing of the end-of-burst detector is known in the art. As an example, a maximum likelihood-based algorithm may be used which produces an end-of-burst signal with a decreasing probability for increasing offset. To minimize the probability that the end-of-burst signal will lie outside the block in which the burst actually ends, the end-of-burst detector takes advantage of the knowledge that the length of a FEC block is at least N-K+1 symbols. This is done by generating the end-of-burst signal at the end of the previous block when the current block is detected to contain no more than (N-K)/2 symbols, where N represents a code word size and K represents a number of information symbols in each code word.

The padding unit (420) is operably coupled to receive and process the symbols of the received burst and to receive the end-of-burst signal from the end-of-burst detector (410). The padding unit (420) is used for providing whole FEC blocks, i.e., N symbols, by appending zero symbols at an end of the data burst as indicated by the end-of-burst signal.

The fixed length FEC decoder (430) is operably coupled to receive the whole FEC blocks generated by the padding unit (420) and is used for providing decoded blocks by decoding the FEC blocks according to an (N,K) code, where N represents a code word size and K represents a number of information symbols in each code word. Most channel errors, as well as errors caused by offset of the end-of-burst signal, will be removed by the FEC decoder.

The output unit (440), is coupled to receive the decoded blocks from the fixed length FEC decoder (430). The output unit (440) removes the (N-K) redundant symbols at the end of each block to produce the decoded burst data. For the final block of the burst data, the output unit (440) also removes the padded symbols following the redundant symbols. As described above, the output unit may determine a number of symbols to be removed in the final FEC block by means of one of: A) a higher layer protocol; B) a length field that is present in a predetermined location in a decoded symbol stream; and C) a predetermined scheme for searching for a predetermined non-zero flag symbol immediately preceding padded zeros in a final decoded block. In order to use method C), the device must be used in conjunction with a transmitter incorporating FEC encoder of the type described in FIG. 2 that provides the insertion of the flag.

Typically, the device is a FEC decoding device (140) incorporated in an FEC system such as shown in FIG. 1, that is based on an (N,K) code of a systematic cyclic type for variable length burst transmission, where N represents a code word size and K represents a number of information symbols in each code word.

Figure 5:
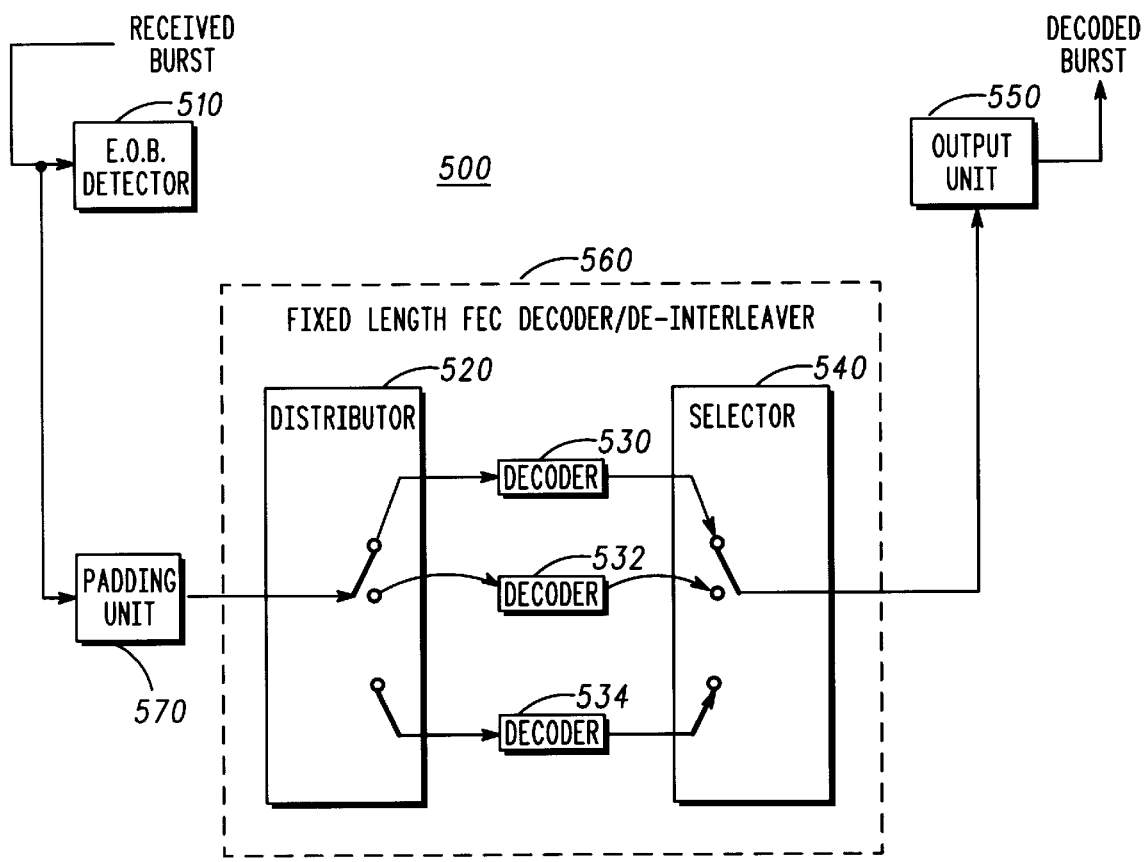
FIG. 5 shows a block diagram of one embodiment of the details of the FEC decoding device incorporating de-interleaving in accordance with the present invention.

In one embodiment, shown in FIG. 5, numeral (500), the device further incorporates de-interleaving in accordance with the present invention. In this embodiment, the device includes an end-of-burst detector (510), a padding unit (570), a fixed length FEC decoder/de-interleaver (560) and an output unit (550).

The end-of-burst detector (510), operably coupled to receive and monitor symbols of a received burst from channel, is used for providing a coarse end-of-burst signal. Its operation is similar to that of (410), except that the detector (510) generates an end-of-burst signal at the end of the previous interleaving frame if the current interleaving frame is detected to contain no more than (N-K)*I/2 symbols. Here, interleaving frame refers to "I" code blocks, i.e., N*I symbols, where N represents a code word size, K represents a number of information symbols in each code word and "I" represents interleaving depth.

The padding unit (570) is operably coupled to receive and process the symbols of the received burst and to receive the end-of-burst signal from the end-of-burst detector (510). Similar to that of the (420), the function of the padding unit (570) is to pad zeros symbols to the received burst upon the end-of-burst detection such that it outputs a whole interleaving frame, i.e., N*I symbols, as the last interleaving frame.

The fixed length FEC decoder/de-interleaver (560) includes: A) a distributor (520) operably coupled to receive symbols of the whole interleaving frames generated by the padding unit (570) and is used for distributing these symbols onto a plurality of outputs in round robin fashion; B) a plurality of decoders (530, 532, . . . , 534) of fixed length type, each operably coupled to accept blocks of symbols from one output of the distributor (520), for providing decoded blocks by decoding the whole FEC blocks; and C) a selector (540), operably coupled to receive the decoded blocks from the plurality of decoders, for generating a decoded symbol stream by sequentially selecting symbols of decoded blocks from each of the plurality of decoders in a round robin fashion that is synchronized with the distributor (520).

The output unit (550) is operably coupled to receive the decoded symbol stream from the selector (540) and provides the decoded burst with the redundant symbols and the padded symbols removed. Its operation is similar to that of output unit (440), except that instead of (N-k) redundant symbols every block, it must remove (N-K)*I redundant symbols every interleaving frame, i.e., "I" blocks. The output unit uses the following rules for determining the symbols to remove. The interleaving frames other than the last consist of K*I payload symbols followed by (N-K)*I redundant symbols. The last interleaving frame consists of possibly less than K*I payload symbols followed by (N-K)*I redundant symbols, followed by the flag if used, and followed by the padded zeros. Clearly, when used, only a single flag is needed to mark the beginning of the padded zeros. When the flag is not used, the number of symbol to be removed in the final interleaving frame c an be determined either by a higher lay protocol or by a length field that is present in a predetermined location in a decoded symbol stream.

The device is typically used as the FEC decoding device (140) in an FEC system such as shown in FIG. 1, where the transmitter incorporates the FEC encoder/interleaver of FIG. 3.

The device shown in FIG. 4 may be viewed as a special case of FIG. 5 with I=1.

The maximum delay of the system incorporating the invented device is determined by the sum of the delay of the individual decoders. This amounts to the worst case delay of N*I symbols. Since there is no delay associated with the transmitter of FIG. 3, this becomes the total end-to-end delay of the coding/interleaving scheme, and clearly this delay is comparable to that of a convolutional interleaver.

As for system complexity, although "I" decoders are needed in FIG. 5, all of the decoders operate at a 1/I symbol rate. Therefore, the effective complexity does not increase as compared to using a single decoder at a symbol rate as in conventional interleaving schemes. The memory needed for interleaving is in each individual decoder. Since no memory is needed at the transmitter, this becomes the total memory requirement for the coding/interleaving scheme. The total amount of memory in the decoders is N*I symbols, i.e., the total memory requirement is comparable to the memory that is needed for convolutional interleaving, which needs N*I/2 symbol memory at the transmitter and the receiver. However, with the invented scheme, all the memory requirements are concentrated in the receiver, the less cost-sensitive part of the system.

FIG. 6, numeral 600, is a flow chart showing the steps of one embodiment of a method of forward error correction (FEC) encoding/interleaving in a variable length burst data transmitter in accordance with the present invention.

In one embodiment, the steps of the method of forward error correction (FEC) encoding in a variable length burst data transmitter include: A) sequentially distributing (602), by a distributor, burst data symbols onto "I" outputs in a round robin fashion, where "I" is a predetermined integer representing a depth of interleaving; and B) providing encoded data symbols (604) by a plurality of encoders by individually encoding each output of the distributor with a systematic cyclic code that is shortened for a last FEC block to accommodate variable length payload burst data; and C) generating an encoded data burst (606) by sequentially selecting encoded data symbols from each of the plurality of encoders in a synchronized round robin fashion. Where selected, step B may include, in an encoder which processes a last symbol of the burst: 1) summing redundant symbols with a predetermined symbol pattern; 2) appending a predetermined flag symbol following the redundant symbols. For ! example, in one embodiment, "I" may be selected to be equal to one.

Figure 7:
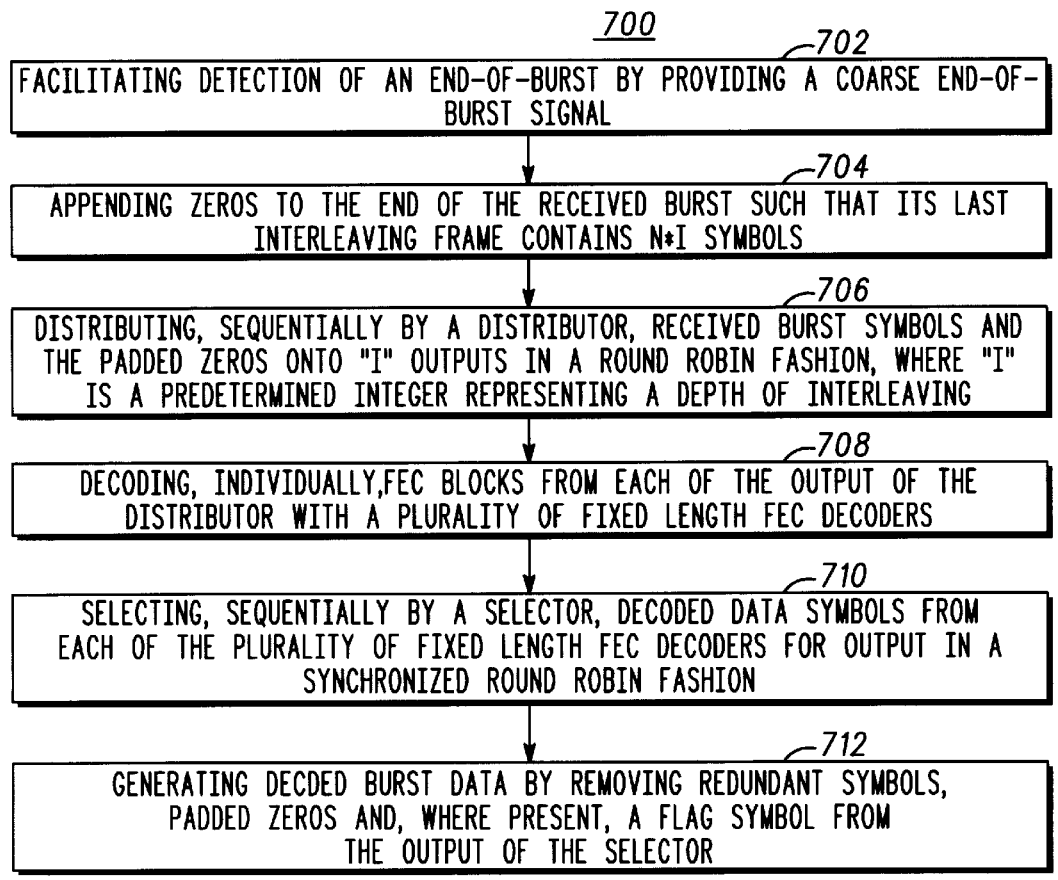
FIG. 7 is a flow chart showing steps of one embodiment of a method for FEC decoding/de-interleaving in accordance with the present invention.

FIG. 7, numeral 700, is a flow chart showing the steps of one embodiment of a method of forward error correction (FEC) decoding/de-interleaving in a variable length burst data receiver in accordance with the present invention. The method includes: A) facilitating detection of an end-of-burst (702) by providing a coarse end-of-burst signal; B) appending zeros (704) to the end of the received burst such that its last interleaving frame contains N*I symbols; C) distributing (706), sequentially by a distributor, received burst symbols and the padded zeros onto "I" outputs in a round robin fashion, such that each of the "I" outputs receives whole FEC blocks, where "I" is a predetermined integer representing a depth of interleaving; D) decoding (708), individually, the whole FEC blocks with a plurality of fixed length FEC decoders; E) selecting (710), sequentially by a selector, decoded data symbols from each of the plurality of fixed length FEC decoders for output in a synchronized round robin fashion; and F) generating decoded burst data (712) by removing redundant symbols, padded zeros and, where present, a flag symbol from the output of the selector. For example, in one embodiment, "I" may be selected to be equal to one.

The method described in conjunction with FIG. 6 and 7 may be implemented in software. Thus, a computer processor may be utilized for forward error correction (FEC) encoding/interleaving and decoding/de-interleaving in a variable length burst transmitter/receiver.

The steps of the method may be embodied in a tangible medium of/for a computer. For example, the steps of the method may be embodied in one of: A) a computer diskette; and B) a memory unit of a computer. Alternatively, the steps of the method may embodied in a tangible medium of/for a Digital Signal Processor, DSP, or a tangible medium of/for an Application Specific Integrated Circuit, ASIC. Also, the steps of the method may be embodied in a tangible medium of a gate array.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A forward error correction, FEC, system based on an (N,K) code for variable length burst transmission, where N represents a code word size and K represents a number of information symbols in each code word, comprising:
   at a transmitter:
   A1) a shortened FEC encoder, coupled to receive from a burst data source, payload burst data, for providing an output of encoded burst data to a channel by encoding the payload burst data block by block, wherein each block contains K information symbols, except a last block which may contain less than K information symbols, and the last block is encoded using a shortened code that is equivalent to encoding a K information symbol block formed by padding zeros at a front of said block; and
   at a receiver:
   B) a FEC decoding device, coupled to receive the encoded burst data from the channel, for providing decoded burst data, comprising:
      B1) a fixed length padding FEC decoder, for decoding the received burst data block by block using a fixed length (N,K) FEC code, wherein the last block is made into a whole block containing N symbols by padding zeros at an end of the block, wherein the number of padded zeros may be different from the number of zeros padded at the encoder; and
      B2) an output unit, coupled to the fixed length padding FEC decoder, for outputting the decoded burst data by removing redundant symbols and padded symbols.

2. The FEC system of claim 1 wherein the (N,K) code is formed by shortening a cyclic code by constraining a necessary number of symbols at the front of the code word to be zero and excluding those symbols from the code word.

3. The FEC system of claim 1 further including, at the transmitter:
   A2) an adder, operably coupled to receive the output of the shortened FEC encoder, for providing an output by summing redundant symbols for the last block by a precomputed symbol pattern, wherein the precomputed symbol pattern comprises redundant symbols of the (N,K) code for a block formed by a predetermined flag symbol followed by (K–1) zero symbols, and by passing the other input symbols unchanged; and
   A3) a flag inserter, operably coupled to receive the output of the adder, for appending a predetermined flag symbol to an end of an encoded burst.

4. The FEC system of claim 1 wherein: p1 A) the shortened FEC encoder further includes an interleaver for interleaving the payload burst data; and B) the FEC decoding device further includes a de-interleaver, coupled to receive the encoded burst data from the channel, for de-interleaving decoded burst data.

5. The FEC system of claim 4 wherein the shortened FEC encoder with an interleaver comprises:
   A) a distributor, coupled to receive the payload burst data from the burst data source, for sequentially distributing the payload burst data onto a plurality of outputs in a round robin fashion;
   B) a plurality of FEC encoders, each operably coupled to an output of the plurality of outputs of the distributor, for providing encoded data symbols by encoding the data symbol from the output of the distributor block by block by adding (N-K) computed redundant symbols to the end of each block, wherein each block contains K symbols except the last block which may contain less than K symbols, and the last block is encoded using shortened code that is equivalent to encoding a K symbol block formed by padding zeros at the front of the block; and
   C) a selector, operably coupled to receive the encoded data symbols from the FEC encoders, for generating encoded burst data by sequentially selecting the encoded data symbols from one of the encoders in a round robin fashion that is synchronized with the distributor.

6. The FEC system of claim 5 wherein each of the FEC encoders further comprises:
   in an FEC encoder processing a last symbol of a burst,
   D1) an adder, operably coupled to the output of the FEC encoder processing the last symbol of the burst, for providing an output by summing redundant symbols for the last block by a precomputed symbol pattern, wherein the precomputed symbol pattern comprises redundant symbols of the (N,K) code for a block formed by a predetermined flag symbol followed by (K–1) zero symbols, and by passing the other input symbols unchanged; and
   D2) a flag inserter, operably coupled to receive the output of the adder, for appending a predetermined flag symbol immediately following the modified redundant symbols;
   and in all other FEC encoders,
   E1) an adder, operably coupled to the output of the FEC encoder, for providing an output by passing the input symbols unchanged; and
   E2) a flag inserter, operably coupled to receive the output of the adder, for providing an output by passing the input symbols unchanged.

7. A device for forward error correction (FEC) decoding in a variable length burst receiver, comprising:
   A) an end-of-burst detector, operably coupled to receive and monitor symbols of a received data burst, for providing an end-of-burst signal upon detecting a final symbol of the received data burst;
   B) a padding unit, operably coupled to receive and process the symbols of the data burst, and to receive the end-of-burst signal, for providing whole FEC blocks by appending zero symbols at an end of the data burst as indicated by the end-of-burst signal;
   C) a fixed length FEC decoder, operably coupled to receive the whole FEC blocks generated by the padding unit, for providing decoded blocks by decoding the FEC blocks; and D) an output unit, operably coupled to receive the decoded blocks, for providing decoded burst data by removing redundant symbols as well as padded symbols.

8. The device of claim 7 wherein the end-of-burst detector generates the end-of-burst signal at an end of a previous FEC block when a current FEC block is detected to contain less than or equal to (N-K)/2 symbols, where N represents a code word size and K represents a number of information symbols in each code word.

9. The device of claim 7 wherein the device is a FEC decoding device incorporated in an FEC system based on an (N,K) code for variable length burst transmission, where N represents a code word size and K represents a number of information symbols in each code word.

10. The device of claim 7 further including, for deinterleaving:
   A) an end-of-burst detector, operably coupled to receive and monitor symbols of the received data burst, for providing an end-of-burst signal upon detecting a final symbol of the data burst;
   B) a padding unit, operably coupled to receive and process the symbols of the data burst, and to receive the end-of-burst signal, for providing whole interleaving frames by appending zero symbols at an end of the data burst as indicated by the end-of-burst signal;
   C) a fixed length FEC decoder/de-interleaver, comprising:
      C1) a distributor, operably coupled to receive the burst symbols and the padded symbols, for processing and distributing these symbols onto a plurality of outputs in round robin fashion; and
      C2) a plurality of decoders of fixed length type, each operably coupled to receive whole FEC blocks from an output of the plurality of outputs of the distributor, for providing decoded blocks by decoding the whole FEC blocks;
      C3) a selector, operably coupled to receive the decoded blocks from the plurality of decoders, for generating a decoded symbol stream by sequentially selecting symbols of decoded blocks from each of the plurality of decoders in a round robin fashion that is synchronized with the distributor; and
   D) an output unit, operably coupled to receive the decoded symbol stream from the selector, for generating decoded burst data by removing redundant symbols and padded symbols.

11. The device of claim 10 wherein the device is a FEC decoding device in a forward error correction and burst interleaving system wherein the forward error correction and burst interleaving system includes:
   A) a shortened FEC encoder having an interleaver for interleaving the payload burst data; and
   B) the FEC decoding device further includes a de-interleaver, coupled to receive the encoded burst data from the channel, for de-interleaving decoded burst data,
based on an (N,K) code of a systematic cyclic type for variable length burst transmission, where N represents a code word size and K represents a number of information symbols in each code word.

12. The device of claim 10 wherein the end-of-burst detector generates the end-of-burst signal at an end of a previous interleaving frame when a current interleaving frame is detected to contain less than or equal to I*(N-K)/2 symbols, where an interleaving frame contains I*N symbols and N represents a code word size and K represents a number of information symbols in each code word.

13. The device of claim 7 wherein the output unit further determines a number of symbols to be removed in a final FEC block or interleaving frame by means of one of:
   A) a higher layer protocol;
   B) a length field that is present in a predetermined location in a decoded symbol stream; and
   C) a predetermined scheme for searching for a predetermined non-zero flag symbol immediately preceding padded zeros in a final decoded block.

14. A method for forward error correction (FEC) encoding and interleaving in a variable length burst data transmitter, comprising the steps of:
   A) at the variable length burst data transmitter:
      A1) sequentially distributing, by a distributor, burst data symbols onto "I" outputs in a round robin fashion, where "I" is a predetermined integer representing a depth of interleaving;
      A2) providing encoded data symbols by a plurality of encoders by individually encoding each output of the distributor with a systematic cyclic code that is shortened for a last FEC block to accommodate variable length payload burst data; and
      A3) generating an encoded data burst by sequentially selecting encoded data symbols from each of the plurality of encoders in a synchronized round robin fashion.

15. The method of claim 14 wherein I=1.

16. The method of claim 14 wherein step A2 at the variable length burst data transmitter, in an encoder which processes a last symbol of the burst includes:
   A3) summing redundant symbols for a final code block with a predetermined symbol pattern; and
   A4) appending a predetermined flag symbol following the redundant symbols.

17. The method of claim 14 wherein the steps of the method are embodied in a tangible medium of/for a computer.

18. The method of claim 17 wherein the tangible medium is one of:
   A) a computer diskette; and
   B) a memory unit of a computer.

19. The method of claim 14 wherein the steps of the method are embodied in a tangible medium of/for a Digital Signal Processor, DSP.

20. The method of claim 14 wherein the steps of the method are embodied in a tangible medium of/for an Application Specific Integrated Circuit, ASIC.

21. The method of claim 14 wherein the steps of the method are embodied in a tangible medium of a gate array.

22. A computerized method for forward error correction (FEC) encoding in a variable length burst data transmitter, comprising the steps of:
   A) at the variable length burst data transmitter:
      A1) sequentially distributing, by a distributor, burst data symbols onto "I" outputs in a round robin fashion, where "I" is a predetermined integer representing a depth of interleaving;
      A2) providing encoded data symbols by a plurality of encoders by individually encoding each output of the distributor with a systematic cyclic code that is shortened for a last FEC block to accommodate variable length payload burst data; and
      A3) generating an encoded data burst by sequentially selecting encoded data symbols from each of the plurality of encoders in a synchronized round robin fashion.

23. The computerized method of claim 22 wherein I=1.

24. The computerized method of claim 22 wherein step A2 at the variable length burst data transmitter, in an encoder which processes a last symbol of the burst includes:
   A2a) summing redundant symbols for a final code block with a predetermined symbol pattern; and
   A2b) appending a predetermined flag symbol following the redundant symbols.

25. A method for forward error correction (FEC) decoding and de-interleaving in a variable length burst data receiver, comprising the steps of:
   B1) facilitating detection of an end-of-burst by providing a coarse end-of-burst signal;
   B2) appending zeros to the end of the received burst such that its last interleaving frame contains N*I symbols;
   B3) distributing, sequentially by a distributor, received burst symbols and the padded zeros onto "I" outputs in a round robin fashion, where "I" is a predetermined integer representing a depth of interleaving;
   B4) decoding, individually, FEC blocks from each of the outputs of the distributor with a plurality of fixed length FEC decoders;
   B5) selecting, sequentially by a selector, decoded data symbols from each of the plurality of fixed length FEC decoders for output in a synchronized round robin fashion; and
   B6) generating decoded burst data by removing redundant symbols, padded zeros and, where present, a flag symbol from the output of the selector.

26. The method of claim 25 wherein the steps of the method are embodied in one of:
   a tangible medium of/for a computer;
   a tangible medium of/for a Digital Signal Processor (DSP);
   a tangible medium of/for an Application Specific Integrated Circuit (ASIC); and
   a tangible medium of a gate array.

27. A computerized method for forward error correction (FEC) decoding in a variable length burst data receiver, comprising the steps of:
   B1) facilitating detection of an end-of-burst by providing a coarse end-of-burst signal;
   B2) appending zeros to the end of the received burst such that its last interleaving frame contains N*I symbols;
   B3) distributing, sequentially by a distributor, received burst symbols and the padded zeros onto "I" outputs in a round robin fashion, where "I" is a predetermined integer representing a depth of interleaving;
   B4) decoding, individually, FEC blocks from each of the outputs of the distributor with a plurality of fixed length FEC decoders;
   B5) selecting, sequentially by a selector, decoded data symbols from each of the plurality of fixed length FEC decoders for output in a synchronized round robin fashion; and
   B6) generating decoded burst data by removing redundant symbols, padded zeros and, where present, a flag symbol from the output of the selector.

* * * * *

UNITED STATES PATENT AND TRADEMARK OFFICE
CERTIFICATE OF CORRECTION

PATENT NO.    : 5,889,791
DATED         : March 30, 1999
INVENTOR(S)   : Jian Yang It is certified that error appears in the above-identified patent and that said Letters Patent is hereby corrected as shown below:

Column 11,
Line 65, delete "p1"

Signed and Sealed this

Twenty-eighth Day of August, 2001

Attest:

NICHOLAS P. GODICI
*Attesting Officer*    *Acting Director of the United States Patent and Trademark Office*